(12) United States Patent
Lee et al.

(10) Patent No.: US 12,500,141 B2
(45) Date of Patent: Dec. 16, 2025

(54) SEMICONDUCTOR DEVICE STRUCTURE AND SEMICONDUCTOR PACKAGE ASSEMBLY

(71) Applicant: XINTEC INC., Taoyuan (TW)

(72) Inventors: Po-Han Lee, Taipei (TW); Wei-Ming Chien, Taoyuan (TW)

(73) Assignee: XINTEC INC., Taoyuan (CN)

( * ) Notice: Subject to any disclaimer, the term of this patent is extended or adjusted under 35 U.S.C. 154(b) by 586 days.

(21) Appl. No.: 17/560,196

(22) Filed: Dec. 22, 2021

(65) Prior Publication Data

US 2022/0216131 A1    Jul. 7, 2022

Related U.S. Application Data

(60) Provisional application No. 63/134,188, filed on Jan. 6, 2021.

(51) Int. Cl.
*H01L 23/48*      (2006.01)
*H01L 23/498*     (2006.01)
*H10D 62/85*      (2025.01)
*H10D 64/23*      (2025.01)

(52) U.S. Cl.
CPC ...... *H01L 23/481* (2013.01); *H01L 23/49822* (2013.01); *H01L 23/49833* (2013.01); *H01L 23/49844* (2013.01); *H10D 62/8503* (2025.01); *H10D 64/258* (2025.01)

(58) Field of Classification Search
None
See application file for complete search history.

(56) References Cited

U.S. PATENT DOCUMENTS

| | | | | |
|---|---|---|---|---|
| 4,622,573 | A | * 11/1986 | Bakeman, Jr. | ...... H01L 29/0847 |
| | | | | 257/376 |
| 2011/0266683 | A1 | * 11/2011 | Feng | ............ H01L 25/074 |
| | | | | 257/773 |
| 2016/0064555 | A1 | * 3/2016 | Chu | ................ H01L 29/7827 |
| | | | | 438/270 |

FOREIGN PATENT DOCUMENTS

CN      102280478 A      12/2011

OTHER PUBLICATIONS

First Office Action issued in counterpart CN patent application No. 202210006904.X on May 29, 2025 by the China National Intellectual Property Administration.

* cited by examiner

*Primary Examiner* — Julio J Maldonado
*Assistant Examiner* — Pinaki Das
(74) *Attorney, Agent, or Firm* — LIU & LIU

(57) ABSTRACT

A semiconductor device structure is provided. The semiconductor device structure includes a semiconductor substrate having a first surface and a second surface opposite thereto. A gallium nitride (GaN)-based device layer is formed on the first surface of the semiconductor substrate and has source, drain, and gate contact regions. First, second, and third through-substrate vias (TSVs) pass through the semiconductor substrate and are respectively electrically connected to the source, drain, and gate contact regions. An insulating liner layer is formed on the second surface of the semiconductor substrate and extends into the semiconductor substrate to separate the second and third TSVs from the semiconductor substrate. A semiconductor package assembly including the semiconductor device structure is also provided.

20 Claims, 3 Drawing Sheets

SEMICONDUCTOR DEVICE STRUCTURE AND SEMICONDUCTOR PACKAGE ASSEMBLY

CROSS REFERENCE TO RELATED APPLICATIONS

This application claims the benefit of U.S. Provisional Application No. 63/134,188, filed Jan. 6, 2021, the entirety of which is incorporated by reference herein.

BACKGROUND OF THE INVENTION

Field of the Invention

The invention relates to semiconductor technology, and in particular to a GaN-based semiconductor device structure with substrate through-substrate vias (TSVs).

Description of the Related Art

Group III nitride-based semiconductor materials are semiconductors that use nitrogen as a group V element in III-V semiconductor materials, such as gallium nitride (GaN), aluminum nitride (AlN), or indium nitride (InN). Since the physical properties of Group III nitride-based semiconductor materials are suitable for high-temperature, high-power, and high-frequency devices, some semiconductor devices (e.g., high electron mobility transistors (HEMTs)) use group III nitride-based semiconductor materials.

In order to reduce the manufacturing cost, group III nitride-based semiconductor devices are widely used in power switches. For example, by fabricating GaN transistors (GaN-on-Si chip) on a lower-cost silicon substrate, GaN power transistors provide low on-resistance (Ron) and high current for per unit effective area of the device. However, in order to benefit from the properties of group III nitride-based semiconductor devices, there is a need to improve the electrical connection and packaging of group III nitride-based semiconductor devices to achieve a package with low inductance and effective thermal management.

Accordingly, there is a need for a novel package capable of eliminating or mitigating the aforementioned problems.

BRIEF SUMMARY OF THE INVENTION

An embodiment of the invention provides a semiconductor device structure including a semiconductor substrate, a gallium nitride (GaN)-based device layer, a first through-substrate via, a second through-substrate via, a third through-substrate via, and an insulating liner. The semiconductor substrate has a first surface and a second surface opposite thereto. The gallium nitride (GaN)-based device layer is formed on the first surface of the semiconductor substrate and has a source contact region, a drain contact region and a gate contact region. The first through-substrate via, second through-substrate via, and third through-substrate via pass through the semiconductor substrate and are electrically connected to the source contact region, the drain contact region and the gate contact region, respectively. The insulating liner is formed on the second surface of the semiconductor substrate. The insulating liner extends into the semiconductor substrate, and separates the second through-substrate via and the third through-substrate via from the semiconductor substrate.

An embodiment of the invention provides a semiconductor package assembly including a circuit substrate and a chip mounted onto the circuit substrate. The chip includes a semiconductor substrate, a gallium nitride (GaN)-based device layer, a source electrode structure, a drain electrode structure, a gate electrode structure, a first redistribution layer, a second redistribution layer, and a third redistribution layer. The semiconductor substrate has an active surface and a non-active surface opposite thereto. The gallium nitride (GaN)-based device layer is formed on the active surface of the semiconductor substrate. The source electrode structure, drain electrode structure, and gate electrode structure extend from the active surface of the semiconductor substrate through (and protrude above) the GaN-based device layer. The first, second, and third redistribution layers extend from the non-active surface of the semiconductor substrate through the semiconductor substrate and are electrically connected to the source electrode structure, the drain electrode structure, and the gate electrode structure, respectively. A portion of the first redistribution layer, a portion of the second redistribution layer and a portion of the third redistribution layer that are formed on the non-active surface of the semiconductor substrate have a first area, a second area, and a third area, respectively. The first area is larger than the second area and the third area.

An embodiment of the invention provides a semiconductor device structure including a semiconductor substrate, a gallium nitride (GaN)-based device layer, a first through-substrate via, a second through-substrate via, a first conductive layer, and a second conductive layer. The semiconductor substrate has an active surface and a non-active surface. The non-active surface is opposite to the active surface. The gallium nitride (GaN)-based device layer is formed on the active surface of the semiconductor substrate and has a first electrode contact region and a second electrode contact region. The first through-substrate via and the second through-substrate via extend through the semiconductor substrate and are electrically connected to the first electrode contact region and the second electrode contact region, respectively. The first conductive layer and the second conductive layer extend onto the non-active surface of the semiconductor substrate from the first through-substrate via and the second through-substrate via, respectively. The first conductive layer and the second conductive layer have a first area and a second area, respectively. The first area is different from the second area.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. In addition, the present disclosure may repeat reference numbers and/or letters in the various embodiments. This repetition is for the purpose of simplicity and clarity, and does not imply any relationship between the different embodiments and/or configurations discussed. Furthermore, when a first material layer is referred to as being on or overlying a second material layer, the first material layer may be in direct contact with the second material layer, or separated from the second material layer by one or more material layers.

The semiconductor package assembly of an embodiment of the present invention is used to package semiconductor chips with GaN devices. In particular, the semiconductor chips can be optionally packaged using a wafer scale package (WSP) process. The above-mentioned wafer-level package process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level package process.

The following embodiments may discuss specific examples. For example, the described semiconductor package assembly and the method for forming the same are applied to group III nitride semiconductor device technology. However, those skilled in the art will recognize that various applications can be used in some other embodiments when they read the present disclosure. It should be noted that the embodiments discussed herein may not describe each of elements that may exist in the structure. For example, the element may be omitted in the accompanying figures when various aspects of the embodiments can be sufficiently expressed through the discussion of the element.

Figure 1:
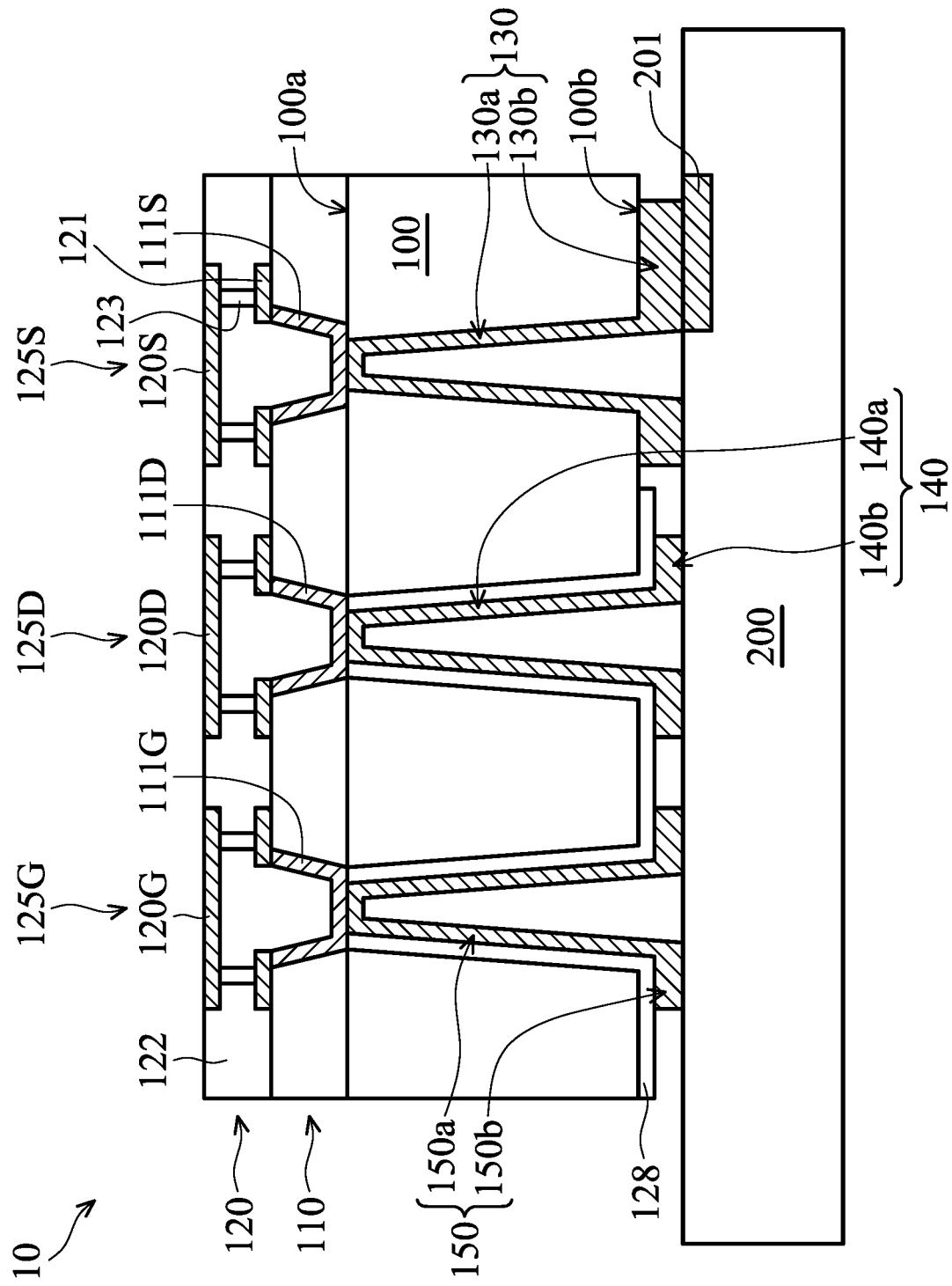
FIG. 1 is a cross-sectional view of an exemplary semiconductor package assembly in accordance with some embodiments of the invention.
Figure 2:
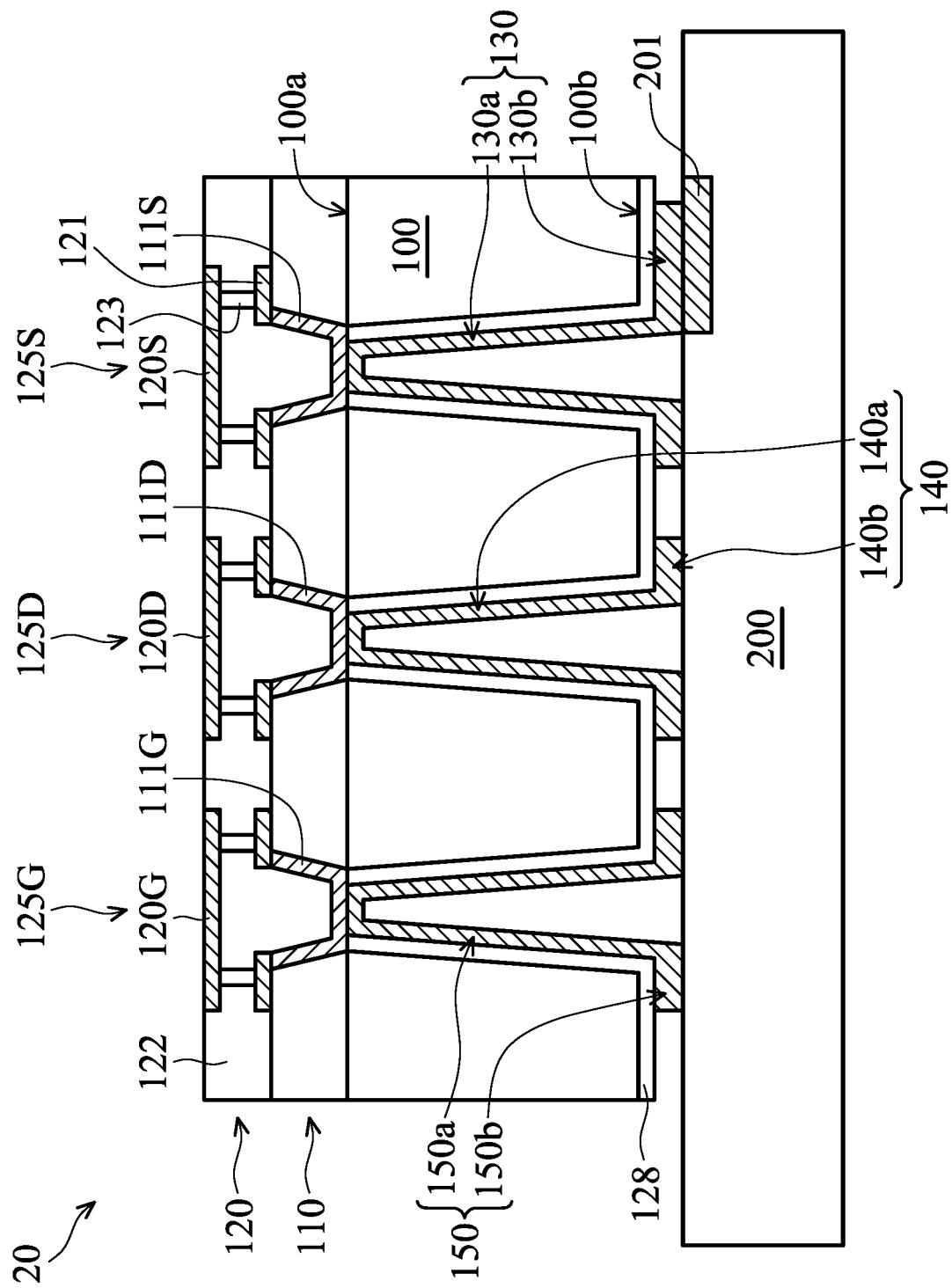
FIG. 2 is a cross-sectional view of an exemplary a semiconductor package assembly in accordance with some embodiments of the invention.
Figure 3:
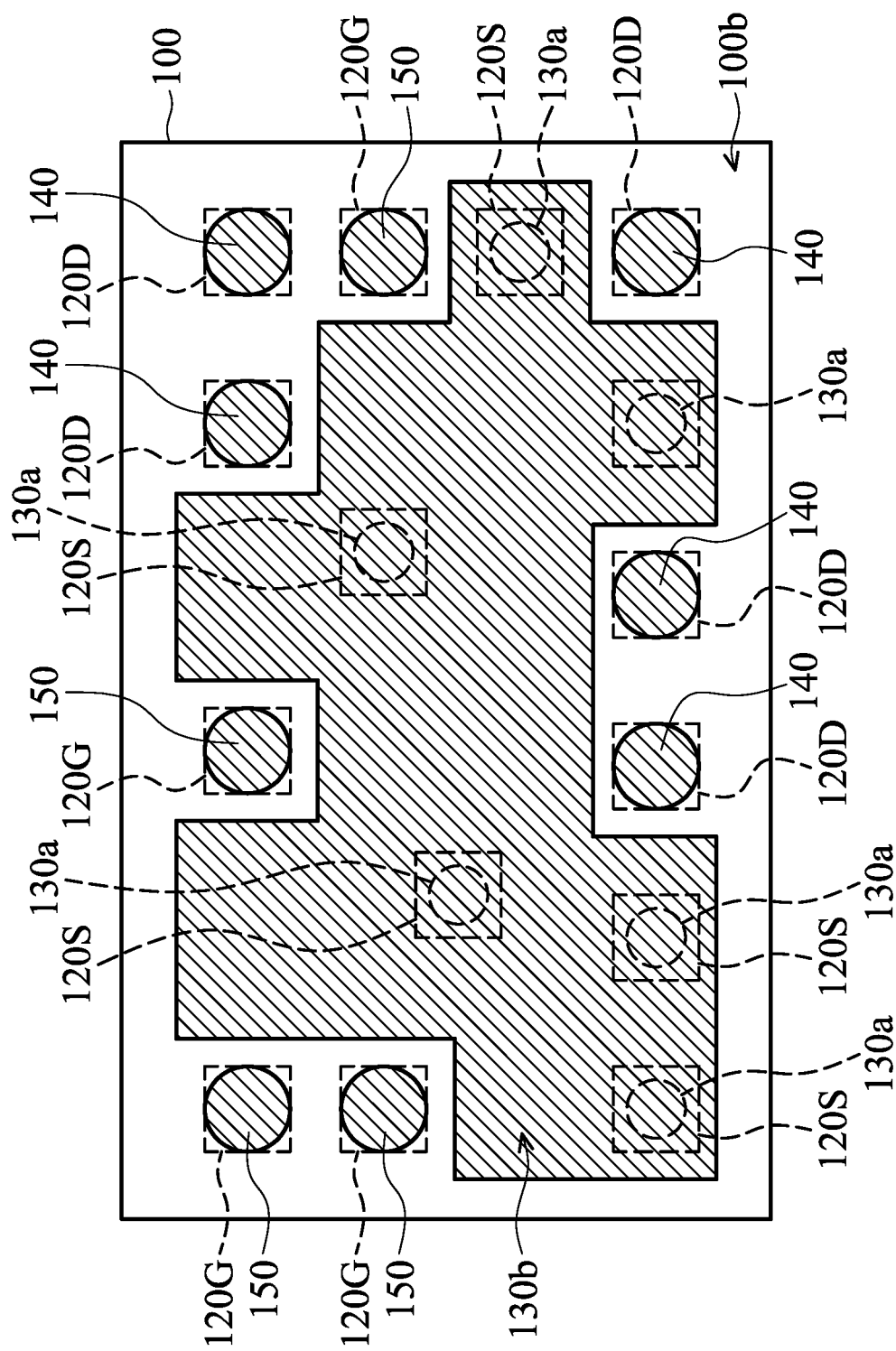
FIG. 3 is a bottom view of an exemplary a semiconductor device structure in accordance with some embodiments of the invention.

FIGS. 1 to 3 illustrate an exemplary semiconductor package assembly in accordance with some embodiments of the invention, in which FIGS. 1 and 2 each illustrate a cross-sectional view of an exemplary semiconductor package assembly in accordance with some embodiments of the invention, and FIG. 3 illustrate a bottom view of an exemplary a semiconductor device structure in accordance with some embodiments of the invention.

Referring to FIG. 1, the semiconductor package assembly 10 includes a circuit substrate 200 and a semiconductor device structure mounted on the circuit substrate 200. In some embodiments, the semiconductor device structure is implemented as a semiconductor chip and includes a semiconductor substrate 100. The semiconductor substrate 100 has a first surface 100a and a second surface 100b opposite thereto. In some embodiments, the first surface 100a is an active surface (which is sometimes referred to as a front surface) of the semiconductor substrate 100. In those cases, the second surface 100b opposite the first surface 100a is a non-active surface (which is sometimes referred to as a rear surface) of the semiconductor substrate 100. The semiconductor substrate 100 may be a silicon substrate, which may be part of a silicon wafer. The semiconductor substrate 100 may also be made of other semiconductor materials. For example, the semiconductor substrate 100 may include an elementary (single-element) semiconductor (e.g., silicon, germanium, and/or other suitable materials), a compound semiconductor (e.g., silicon carbide, gallium arsenide, gallium phosphide, indium phosphide, indium arsenide, indium antimony and/or other suitable materials), an alloy semiconductor (e.g., SiGe, GaAsP AlInAs, AlGaAs, GaInAs, GaInP, GaInAsP, and/or other suitable materials). In some other embodiments, the semiconductor substrate 100 is a silicon-on-insulator (SOI) substrate having a silicon layer formed on a silicon oxide layer.

In some embodiments, the semiconductor device structure further includes a group III nitride-based semiconductor device layer 110 formed on a first surface 100a of the semiconductor substrate 100. In some embodiments, the group III nitride-based semiconductor device layer 110 is a gallium nitride (GaN)-based device layer (i.e., a GaN device layer) that is employed for defining one or more GaN devices (not shown), such as GaN power transistors. In those cases, the semiconductor device structure is also referred to as a GaN chip.

In some embodiments, the group III nitride-based semiconductor device layer 110 employed for defining one or more transistors has electrode contact regions, including one or more source contact regions, one or more drain electrode contact regions, and one or more gate contact regions. Herein, in order to simplify the diagram, only a source contact region 111S, a drain contact region 111D, and a gate contact region 111G are depicted. Furthermore, it is understood that the arrangement of the source contact region 111S, the drain contact region 111D, and the gate contact region 111G is not limited to the embodiment shown in FIG. 1. For example, the gate contact region 111G may be located between the source contact region 111S and the drain contact region 111D.

In some embodiments, the group III nitride-based semiconductor device layer 110 has a lower surface in contact with a first surface 100a of semiconductor substrate 100 and an upper surface opposite to the first surface 100a. The source contact region 111S, the drain contact region 111D, and the gate contact region 111G extend from the upper surface of the group III nitride-based semiconductor device layer 110 to the lower surface of the group III nitride-based semiconductor device layer 110, thereby passing through the lower surface of the group III nitride-based semiconductor device layer 110. In some embodiments, only the source contact region 111S passes through the group III nitride-based semiconductor device layer 110. The drain contact region 111D and the gate contact region 111G are formed on the upper surface of the group III nitride-based semiconductor device layer 110.

In some embodiments, the semiconductor device structure further includes an interconnect structure 120 formed on the group III nitride-based semiconductor device layer 110. The interconnect structure 120 includes an insulating layer 122 and electrode structures formed in the insulating layer 122.

In some embodiments, the insulating layer 122 surrounds each of the electrode structures and includes a dielectric material. For example, the insulating layer 122 may be made of an oxygen-containing dielectric material, such as tetra ethyl ortho silicate (TEOS) oxide, phospho-silicate glass (PSG), boro-silicate glass (BSG), boron-doped phospho-silicate glass (BPSG), or the like.

In some embodiments, the electrode structure includes corresponding electrode contact regions in the group III nitride-based semiconductor device layer 110, such that the electrode structures extend from the first surface 100a (i.e., active surface) of the semiconductor substrate 100 through and protrudes above the group III nitride-based semiconductor device layer 110. Herein, in order to simplify the diagram, only a source electrode structure 125S, a drain electrode structure 125D, and a gate electrode structure 125G are depicted.

In some embodiments, each of the electrode structures further includes a stack in the insulating layer 122 that includes multi-level metal layers and metal plugs connecting between the multi-level metal layers. In order to simplify the diagram, each of the electrode structures is depicted with only an uppermost metal that acts as a pad, a lowermost metal that is electrically connected to the corresponding electrode contact region, and two metal plugs for electrically connecting between the uppermost metal and the lowermost metal. For example, the source electrode structure 125S includes a source pad 120S (which is also referred to as a source electrode), corresponding metal plugs 123, a corresponding lowermost metal 121, and a corresponding source contact region 111S. The drain electrode structure 125D includes a drain electrode pad 120D (which is also referred to as a drain electrode), corresponding metal plugs 123, a corresponding lowermost metal 121, and a corresponding drain electrode contact 111D. The gate electrode structure 125G includes a gate pad 120G (which is also referred to as a gate electrode), corresponding metal plugs 123, a corresponding lowermost metal 121, and corresponding lowermost metal 121. The gate electrode structure 125G includes a gate pad 120G (also referred to as a gate electrode), a corresponding metal plug 123, a corresponding lowermost metal 121, and a corresponding gate contact region 111G.

In some embodiments, the semiconductor device structure further includes through-substrate vias formed in semiconductor substrate 100 and corresponding to the electrode contact region of the group III nitride-based semiconductor device layer 110. Herein, for simplify the diagram, with only one through-substrate via 130a corresponding to the source contact region 111S, one through-substrate via 140a corresponding to the drain contact region 111D, and one through-substrate via 150a corresponding to the gate contact region 111G are depicted. In some embodiments, the through-substrate via 130a extends from the second surface 100b of semiconductor substrate 100 to the first surface 100a of semiconductor substrate 100, and is electrically connected to the source contact region 111S of Group III nitride-based semiconductor device layer 110. Similarly, the through-substrate via 140a extends from the second surface 100b of semiconductor substrate 100 to the first surface 100a of semiconductor substrate 100, and is electrically connected to the drain contact region 111D of Group III nitride-based semiconductor device layer 110. The through-substrate via 150a extends from the second surface 100b of the semiconductor substrate 100 extends to the first surface 100a of the semiconductor substrate 100, and is electrically connected to the gate contact region 111G of the group III nitride-based semiconductor device layer 110. In some other embodiments, the gate contact region 111D and the gate contact region 111G are formed on the upper surface of the group III nitride-based semiconductor device layer 110, the through-substrate vias 140a and 150a further pass through the group III nitride-based semiconductor device layer 110, and are electrically connected to the corresponding drain contact region 111D and the corresponding gate contact region 111G, respectively.

In some embodiments, through-substrate vias 130a, 140a, and 150a include a metallic material, such as aluminum, copper, titanium, tungsten, tantalum, nickel, an alloy thereof, or a combination thereof, or another suitable metallic material.

In some embodiments, the semiconductor device structure further includes conductive layers corresponding to through-substrate vias 130a, 140a and 150a. For example, a conductive layer 130b may corresponds to the through-substrate via 130a, a conductive layer 140b may corresponds to the through-substrate via 140a and a conductive layer 150b may corresponds to the through-substrate via 150a. The conductive layers 130b, 140b, and 150b respectively extend from one end of through-substrate vias 130a, 140a, and 150a that is adjacent to the second surface 100b of semiconductor substrate 100 to the second surface 100b on semiconductor substrate 100.

In some embodiments, the combination of each of the through-substrate vias 130a, 140a, and 150a with the corresponding conductive layer (130b, 140b, or 150b) is also referred to as a redistribution layers (RDL). In those cases, the combination of the through-substrate via 130a and the conductive layer 130b forms a redistribution layer 130. That is, the redistribution layer 130 has a first portion (i.e., the through-substrate via 130a) in the semiconductor substrate 100, and a second portion (i.e., the conductive layer 130b) on the second surface (i.e., the non-active surface) 100b of the semiconductor substrate 100. Similarly, the combination of the through-substrate via 140a and the conductive layer 140b forms redistribution layer 140. That is, the redistribution layer 140 has a first portion (i.e., the through-substrate via 140a) in the semiconductor substrate 100, and a second portion (i.e., the conductive layer 140b) on the second surface (i.e., non-active surface) 100b of the semiconductor substrate 100. Furthermore, the combination of through-substrate via 150a and conductive layer 150b forms a redistribution layer 150. The redistribution layer 150 has a first portion (i.e., through-substrate via 150a) in semiconductor substrate 100, and a second portion (i.e., conductive layer 150b) on the second surface 100b of semiconductor substrate 100. In some embodiments, the respective conductive layers 130b, 140b, and 150b of the redistribution layers 130, 140, and 150 have pad regions (not shown) that serve as bonding regions (e.g., the source pad region, the drain pad region, and the gate pad region) with the circuit substrate 200.

In some embodiments, the through-substrate vias 130a, 140a, and 150a and the corresponding conductive layers 130b, 140b, and 150b are formed of the same metal material layer. In some other embodiments, the metal material of the through-substrate via 130a, 140a, and 150a is different than the metal material of the conductive layers 130b, 140b, and 150b.

In some embodiments, the conductive layers 130b, 140b, and 150b have a first area, a second area, and a third area, respectively, and the first area is different than the second area and the third area. Herein, the first area, the second area, and the third area represent the areas of the conductive layers 130b, 140b, and 150b projected onto the second surface 100b of the semiconductor substrate 100, respectively. In some embodiments, the first area is larger than the second area and the third area, as shown in FIG. 3. Furthermore, the second area may be the same as or different than the third area.

Referring again to FIG. 3, which illustrates a bottom view of a semiconductor device structure including source pads 120S, drain pads 120D, and gate pads 120G is shown. For clarity purposes, the semiconductor device structure in FIG. 3 does not show the insulating liner 128 formed on the second surface 100b of the semiconductor substrate 100. In some embodiments, several or all of the source pads 120S are electrically connected to each other via corresponding through-substrate vias 130a (indicated by dashed circles) and a single conductive layer 130b (which is also referred to as a common conductive layer) extending from the through-substrate via 130a. Furthermore, gate pads 120G are electrically connected to the corresponding redistribution layer 140 without being electrically connected to each other. Similarly, gate pads 120G are electrically connected to the corresponding redistribution layer 150 without being electrically connected to each other. As a result, the area of such a common conductive layer 130b is larger than the area of the conductive layer of each redistribution layer 140 and the area of the conductive layer of each redistribution layer 150.

In some embodiments, the common conductive layer 130b having a large area serves as a heat dissipation layer to efficiently conduct the heat generated by the semiconductor device structure to the circuit substrate 200 and/or the external environment. As a result, the thermal management of the package assembly 10 can be effectively improved. It is understood that the shape and size of the common conductive layer 130b can be adjusted according to design requirements and therefore those are not limited to the embodiment shown in FIG. 3.

In some embodiments, the semiconductor device structure further includes an insulating liner 128 formed on a second surface 100b of the semiconductor substrate 100. The insulating liner 128 also extends into the semiconductor substrate 100, such that the redistribution layers 140 and 150 (i.e., the through-substrate via 140a and 150a and the corresponding conductive layers 140b and 150b) are separated from and electrically isolated from the semiconductor substrate 100. In those cases, the insulating liner 128 surrounds the through-substrate vias 140a and 150a formed in the semiconductor substrate 100. In some embodiments, the insulating liner 128 includes an oxide (e.g., silicon oxide) or other suitable inorganic materials (e.g., silicon nitride, silicon oxynitride, metal oxide, or a combination thereof).

In some embodiments, the semiconductor substrate 100 separates the insulating liner 128 from the redistribution layer 130 (i.e., the through-substrate via 130a and the corresponding conductive layer 130b), such that the redistribution layer 130 is in direct contact with semiconductor substrate 100. As a result, the redistribution layer 130 can serve as a ground layer, such that the source contact region 111S is grounded through the semiconductor substrate 100, thereby reducing the noise in the semiconductor device structure.

In some embodiments, the circuit substrate 200 (e.g., the package substrate) has a ground pad 201 that is electrically connected to the conductive layer 130b of the redistribution layer 130. As a result, the ground contact region 111S is also grounded through the ground pad 201 of the circuit substrate 200, thereby reducing the noise in the semiconductor device structure further.

Moreover, the circuit substrate 200 also has signal pads (not shown) to be bonded with the conductive layer 140b of the redistribution layer 140 and the conductive layer 150b of the redistribution layer 150, so that the semiconductor device structure is mounted onto the circuit substrate 200 to form the package assembly 10. Namely, in the package assembly 10, the drain contact region 111D and the gate contact region 111G in the group III nitride-based semiconductor device layer 110 can be electrically connected to the circuit substrate 200 by the redistribution layers 140 and 150.

Referring to FIG. 2, which illustrates a cross-sectional view of the semiconductor package assembly 20 in accordance with some embodiments of the invention. Elements in FIG. 2 that are the same as those in FIG. 1 are labeled with the same reference numbers as in FIG. 1 and are not described again for brevity. In some embodiments, the structure of the semiconductor package assembly 20 is similar to that of the semiconductor package assembly 10 in FIG. 1, with the difference that the insulating liner 128 extends between the redistribution layer 130 (i.e., the through-substrate via 130a and the corresponding conductive layer 130b) and the semiconductor substrate 100, so as to separate them from each other and thus the redistribution layer 130 is electrically isolated from the semiconductor substrate 100. In those cases, the insulating liner 128 surrounds the through-substrate via 130a formed in the semiconductor substrate 100.

According to the aforementioned embodiments, since the source contact region(s), the drain contact region(s), and the gate contact region(s) in the group III nitride-based semiconductor device layer in the package assembly are electrically connected to the circuit substrate through the corresponding through-substrate vias, the semiconductor device structure cab be boned with circuit substrate without using any bonding wires. As a result, the process can be simplified and the use of costly bonding wires (e.g., gold wires) can be eliminated.

According to the aforementioned embodiments, by the use of the through-substrate vias instead of bonding wires, the internal connection path can be shortened to achieve a package with low inductance and the package assembly size (e.g., height) can be reduced.

According to the aforementioned embodiments, since the through-substrate vias connected to the source contact region is in direct contact with the semiconductor substrate, device noise can be reduced and effective thermal management can be achieved.

According to the aforementioned embodiments, several or all of the source contact regions in the group III nitride-based semiconductor device layer can be electrically connected to a common conductive layer having a large area through the corresponding through-substrate vias. The common conductive layer having a large area can serve as a heat dissipation layer to efficiently conduct the heat generated by the semiconductor device structure to the circuit substrate and/or the external environment. As a result, the thermal management of the package assembly can be improved further.

While the invention has been disclosed in terms of the preferred embodiments, it is not limited. The various embodiments may be modified and combined by those skilled in the art without departing from the concept and scope of the invention.

What is claimed is:

1. A semiconductor device structure, comprising:
a semiconductor substrate having a first surface and a second surface opposite thereto;
a gallium nitride (GaN)-based device layer formed on the first surface of the semiconductor substrate and having a source contact region, a drain contact region and a gate contact region;
a first through-substrate via, a second through-substrate via, and a third through-substrate via passing through the semiconductor substrate and electrically connected to the source contact region, the drain contact region and the gate contact region, respectively; and
an insulating liner formed on the second surface of the semiconductor substrate, extending into the semiconductor substrate, and separating the second through-substrate via and the third through-substrate via from the semiconductor substrate, so that the first surface is substantially level with a first interface between the insulating liner and the drain contact region and a second interface between the insulating liner and the gate contact region, wherein the first and second interfaces are substantially level with a third interface between the second through-substrate via and the drain contact region and a fourth interface between the third through-substrate via and the gate contact region, respectively.

2. The semiconductor device structure as claimed in claim 1, wherein the first through-substrate via is in direct contact with the semiconductor substrate.

3. The semiconductor device structure as claimed in claim 1, wherein the insulating liner separates the first through-substrate via from the semiconductor substrate.

4. The semiconductor device structure as claimed in claim 1, further comprising:
an interconnect structure formed on the GaN-based device layer, wherein the interconnect structure has a source pad, a drain pad, and a gate pad electrically connected to the source contact region, the drain contact region, and the gate contact region, respectively.

5. The semiconductor device structure as claimed in claim 1, further comprising:
a first conductive layer, a second conductive layer and a third conductive layer extending from the first through-substrate via, the second through-substrate via and the third through-substrate via, respectively, onto the second surface of the semiconductor substrate.

6. The semiconductor device structure as claimed in claim 5, wherein the first conductive layer, the second conductive layer and the third conductive layer have a first area, a second area and a third area, respectively, and the first area is different from the second area and the third area.

7. The semiconductor device structure as claimed in claim 6, wherein the first area is larger than the second area and the third area.

8. The semiconductor device structure as claimed in claim 1, wherein the device layer has a bottom surface that is substantially level with the first and second interfaces, so that a top surface of the device layer is higher than the first and second interfaces.

9. A semiconductor package assembly, comprising:
a circuit substrate; and
a chip mounted onto the circuit substrate, comprising:
a semiconductor substrate having an active surface and a non-active surface opposite thereto;
a gallium nitride (GaN)-based device layer formed on the active surface of the semiconductor substrate;
a source electrode structure, a drain electrode structure, and a gate electrode structure extending from the active surface of the semiconductor substrate through and protruding above the GaN-based device layer;
a first redistribution layer, a second redistribution layer, and a third redistribution layer extending from the non-active surface of the semiconductor substrate through the semiconductor substrate and electrically connected to the source electrode structure, the drain electrode structure, and the gate electrode structure, respectively; and
a first insulating liner and a second insulating liner surrounding the second redistribution layer and the third redistribution layer in the semiconductor substrate, respectively,
wherein a bottom surface of the device layer is substantially level with top surfaces of the first and second insulating liners, so that a top surface of the device layer is higher than the top surfaces of the first and second insulating liners, and
wherein a portion of the first redistribution layer, a portion of the second redistribution layer and a portion of the third redistribution layer that are formed on the non-active surface of the semiconductor substrate have a first area, a second area, and a third area, respectively, and the first area is larger than the second area and the third area.

10. The semiconductor package assembly as claimed in claim 9, wherein the first and second insulting liners are separated from the first redistribution layer.

11. The semiconductor package assembly as claimed in claim 10, wherein the semiconductor substrate is in direct contact with the first redistribution layer.

12. The semiconductor package assembly as claimed in claim 9, wherein the chip further comprises:
a third insulating liner surrounding the first redistribution layer in the semiconductor substrate.

13. The semiconductor package assembly as claimed in claim 9, wherein the chip further comprises:
an insulating layer formed on the GaN-based device layer and surrounding the source electrode structure, the drain electrode structure, and the gate electrode structure.

14. The semiconductor package assembly as claimed in claim 9, wherein the circuit substrate has a ground pad electrically connected to the first redistribution layer.

15. A semiconductor device structure, comprising:
a semiconductor substrate having an active surface and a non-active surface opposite to the active surface;
a gallium nitride (GaN)-based device layer formed on the active surface of the semiconductor substrate and having a first electrode contact region and a second electrode contact region;
a first through-substrate via and a second through-substrate via that extend through the semiconductor substrate and that are electrically connected to the first electrode contact region and the second electrode contact region, respectively;
a first conductive layer and a second conductive layer that extend onto the non-active surface of the semiconductor substrate from the first through-substrate via and the second through-substrate via, respectively, wherein the first conductive layer and the second conductive layer have a first area and a second area, respectively, and the first area is different from the second area; and
a first insulating liner formed between the semiconductor substrate and the second through-substrate via and between the semiconductor substrate and the second conductive layer, wherein a bottom surface of the device layer is substantially level with a top surface of the first insulating liner, so that a top surface of the device layer is higher than the top surface of the first insulating liner.

16. The semiconductor device structure as claimed in claim 15, wherein the first electrode contact region is a source contact region, and the second electrode contact region is a drain contact region or a gate contact region.

17. The semiconductor device structure as claimed in claim 16, wherein the first area is larger than the second area.

18. The semiconductor device structure as claimed in claim 16, wherein the first insulating liner is separated from the first through-substrate via and the first conductive layer, and wherein the first through-substrate via and the first conductive layer are in direct contact with the semiconductor substrate.

19. The semiconductor device structure as claimed in claim 15, further comprising:

a second insulating liner formed between the semiconductor substrate and the first through-substrate via and between the semiconductor substrate and the first conductive layer.

20. The semiconductor device structure as claimed in claim 15, further comprising:
a source electrode formed on the GaN-based device layer and electrically connected to the first electrode contact region; and
a drain electrode or a gate electrode formed on the GaN-based device layer and electrically connected to the second electrode contact region.

* * * * *